(12) United States Patent
Miyawaki et al.

(10) Patent No.: US 10,923,444 B1
(45) Date of Patent: Feb. 16, 2021

(54) SEMICONDUCTOR DEVICE

(71) Applicant: Mitsubishi Electric Corporation, Tokyo (JP)

(72) Inventors: Katsumi Miyawaki, Tokyo (JP); Kenichiro Chomei, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/490,481

(22) PCT Filed: May 26, 2017

(86) PCT No.: PCT/JP2017/019793
§ 371 (c)(1),
(2) Date: Aug. 30, 2019

(87) PCT Pub. No.: WO2018/216219
PCT Pub. Date: Nov. 29, 2018

(51) Int. Cl.
| | |
|---|---|
| H01L 23/34 | (2006.01) |
| H01L 23/66 | (2006.01) |
| H01L 23/498 | (2006.01) |
| H01L 23/367 | (2006.01) |
| H01L 23/31 | (2006.01) |

(52) U.S. Cl.
CPC .......... *H01L 23/66* (2013.01); *H01L 23/3121* (2013.01); *H01L 23/3672* (2013.01); *H01L 23/49861* (2013.01)

(58) Field of Classification Search
CPC combination set(s) only.
See application file for complete search history.

(56) References Cited

U.S. PATENT DOCUMENTS

| | | |
|---|---|---|
| 8,937,374 B2 | 1/2015 | Uno et al. |
| 2004/0113248 A1 | 6/2004 | Ito et al. |

FOREIGN PATENT DOCUMENTS

| | | |
|---|---|---|
| JP | S63-124759 U | 8/1988 |
| JP | H01-99247 A | 4/1989 |
| JP | H03-167848 A | 7/1991 |
| JP | H03-167868 A | 7/1991 |
| JP | H04-278570 A | 10/1992 |
| JP | 2004-200264 | 7/2004 |
| WO | 2013/094101 A1 | 6/2013 |

OTHER PUBLICATIONS

International Search Report; Written Opinion; and Notification of Transmittal of the International Search Report and the Written Opinion of the International Searching Authority, or the Declaration issued in PCT/JP2017/019793; dated Aug. 15, 2017.

*Primary Examiner* — Robert G Bachner
(74) *Attorney, Agent, or Firm* — Studebaker & Brackett PC

(57) ABSTRACT

A semiconductor chip (2,3) is mounted on a heat sink (1). Plural lead terminals (5,6) are connected to the semiconductor chip (2,3). The plural lead terminals (5,6) include a first lead terminal through which a high frequency signal passes. Plural dielectric materials (10,11) separated from each other are individually provided between the plural lead terminals (5,6) and the heat sink (1). Sealing resin (12) seals the semiconductor chip (2,3), the plural lead terminals (5,6) and the plural dielectric materials (10,11).

8 Claims, 5 Drawing Sheets

SEMICONDUCTOR DEVICE

FIELD

The present invention relates to a semiconductor device.

BACKGROUND

Attention is paid to high output in a wireless communication device market represented by mobile phone base stations. In this field, GaN devices are becoming mainstream because of the demand for wider bandwidth and smaller size due to increase in communication capacity. On the other hand, the demand for cost reduction of devices is severe, and a study of a lower cost molded package structure is also progressing in the GaN devices. In a molded package, a structure in which a device is mounted on a single metal strip having a thickness of about 0.1 to 0.3 mmt, that is, a lead frame and encapsulated with resin is well used as represented by SOP, QFN or the like.

However, in the molded package requiring high output power such as the GaN device, such a thin lead frame lacks heat capacity. Therefore, there is considered a lead frame with a heat sink in which a heat sink having a thickness of around 1.0 mmt and formed of copper or the like is used in an area where a GaN device, etc. are mounted and the heat sink is fixed to a conventional lead frame having a thickness of about 0.2 mmt by a caulking method or the like.

In the lead frame with the heat sink, lead terminals are arranged on the top surface of the heat sink, and sealing resin is filled between the heat sink and each lead terminal. Therefore, particularly, with respect to lead terminals through which high frequency signals pass, a microstrip line is configured by the heat sink serving as GND, the lead terminals and the sealing resin. In order to minimize the loss of high frequency characteristics in this microstrip line, it is necessary to set an optimum characteristic impedance taking account of the characteristic of the GaN device and a high frequency circuit. In this design, the width of the lead terminals on the heat sink, the distance between the lead terminal and the heat sink, and the dielectric constant of a dielectric material sandwiched between the lead terminal and the heat sink are adjusted.

The width of the lead terminals can be freely changed. However, in the lead frame with the heat sink, the entire package is filled with the sealing resin. The sealing resin is generally epoxy resin. Therefore, the dielectric constant of the part between the lead terminal and the heat sink is fixed to about 3 to 4 which is the dielectric constant of the epoxy resin, and thus there is no degree of freedom in selecting the dielectric constant. In addition, since the heat sink is fixed by bending a part of the lead frame, the distance between the lead terminal and the heat sink is determined by the amount of the bending. However, it is impossible to set this distance to be extremely short or long due to the limit of bending processing and the limit of processing accuracy. Due to these restrictions on the package structure, the characteristic impedance of the lead terminals cannot be set to a target value, and the package structure has a large loss in high frequency characteristics.

As variation of the characteristic impedance from the GaN device through a wire to the lead terminal and a secondary mounting external circuit is smaller, the loss of the high frequency characteristic is smaller. However, since the wire between the GaN device and the lead terminal is long, the loss of the high frequency characteristic is large. Therefore, in order to shorten the wire length, a method is known which makes the lead terminals closer to the inside of the heat sink so that the lead terminals approach the GaN device. However, since the lead terminals are only fixed in midair above the heat sink, it is impossible to stably transmit ultrasonic waves or a load when the lead terminals are made closer to the inside, so that non joining of wire bond occurs. In addition, since the heat sink cannot be arranged so as to extend to the outside of the package, the heat sink does not exist below the lead terminals at the peripheral portion of the package. Therefore, since the variation in the characteristic impedance is large, transmission loss occurs in the high frequency signal.

In order to fix the heat sink and the lead frame, a caulking method is adopted which inserts a convex dowel formed on the heat sink into a hole formed in the lead frame to crush the convex shape, thereby fixing them. Accordingly, a mold required for producing the lead frame is complicated, and it is necessary to prepare a mold for performing the caulking. In addition, the distance between the lead terminal and the heat sink cannot be reduced. Since the gap between the lead terminal and the heat sink is filled with epoxy resin, the dielectric constant is fixed to 3 to 5. Therefore, when it is desired to lower the characteristic impedance of the lead portion from the characteristic of the GaN device, the number of adjustable parameters is small and many restrictions are imposed, so that the characteristic impedance cannot be set to an optimal value.

On the other hand, it has been proposed that the characteristic impedance is reduced to reduce noise by sticking insulating adhesive resin onto a die pad serving as GND and bonding lead terminals onto the insulating adhesive resin (for example, see Patent Literature 1). As a result, the caulking method is unnecessary, and the mold cost and the processing cost can be reduced. In addition, since the lead terminals are sufficiently fixed by interposing the insulating adhesive resin between the die pad and the lead terminals, wire bonding can be stably performed on the lead terminals.

CITATION LIST

Patent Literature

[PTL 1] Japanese Unexamined Utility Model Application Publication No. S63-124759 A

SUMMARY

Technical Problem

In the prior art, one insulating adhesive resin is commonly used for plural lead terminals, and the plural lead terminals are bonded to the die pad. Therefore, it has been impossible to set the characteristic impedance of the lead terminals through which high frequency signals pass to a value optimum for the characteristic of the GaN device. As a result, it has been impossible to suppress the loss of high frequency characteristics.

The present invention has been made to solve the problem as described above, and has an object to obtain a semiconductor device capable of suppressing the loss of high frequency characteristics.

Solution to Problem

A semiconductor device according to the present invention includes: a heat sink; a semiconductor chip mounted on the heat sink; plural lead terminals connected to the semiconductor chip and including a first lead terminal through which a high frequency signal passes; plural dielectric materials individually provided between the plural lead terminals and the heat sink and separated from each other; and sealing resin sealing the semiconductor chip, the plural lead terminals and the plural dielectric materials.

Advantageous Effects of Invention

In the present invention, the plurality of dielectric materials are individually provided between the plurality of lead terminals and the heat sink, and separated from each other. Therefore, the area where the lead terminals passing high frequency signals overlap the heat sink, and the dielectric constant and thickness of the dielectric material between the lead terminal and the heat sink can be individually adjusted. Therefore, the characteristic impedances of the lead terminals through which high frequency signals pass can be set to values optimum for the characteristics of the GaN devices. As a result, the loss of the high frequency characteristic can be suppressed.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
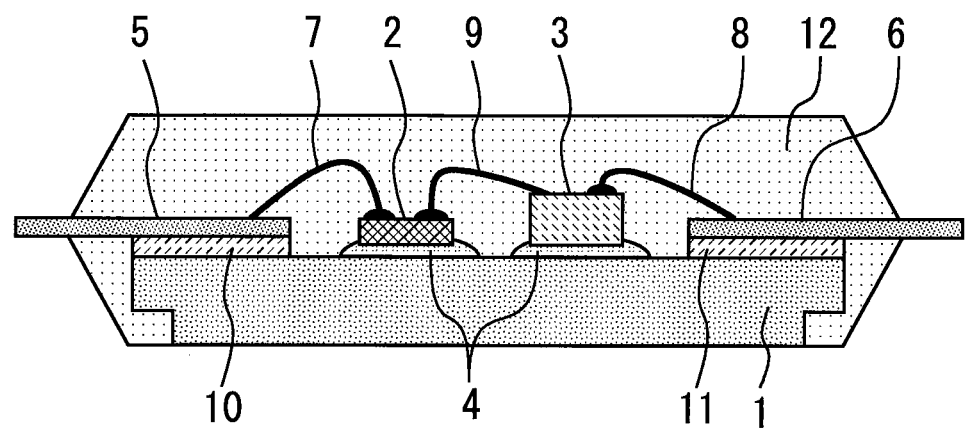
FIG. 1 is a cross-sectional view showing a semiconductor device according to a first embodiment of the present invention.
Figure 2:
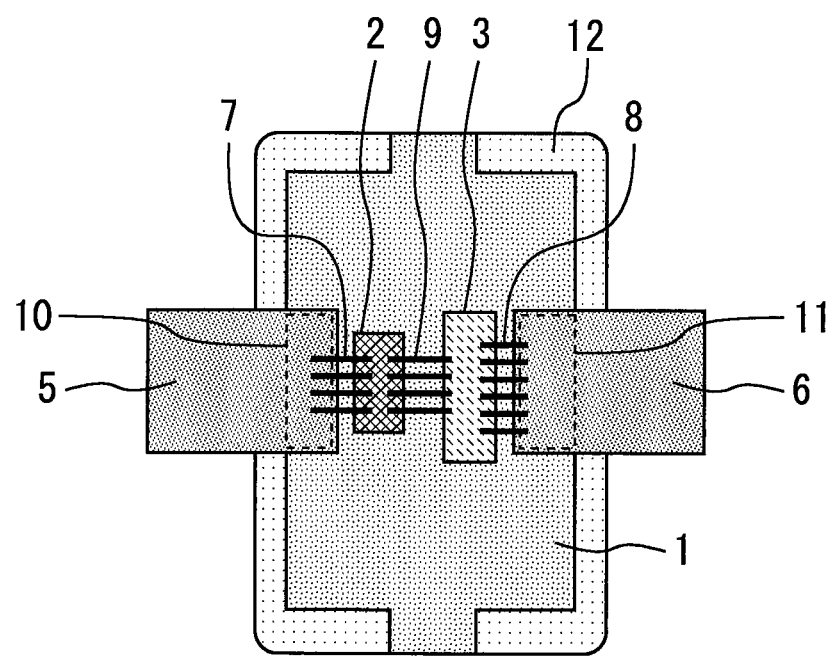
FIG. 2 is a plan view showing the inside of the semiconductor device according to the first embodiment of the present invention.

FIG. 1 is a cross-sectional view showing a semiconductor device according to a first embodiment of the present invention. FIG. 2 is a plan view showing the inside of the semiconductor device according to the first embodiment of the present invention. The semiconductor device outputs power of 1 GHz or more in frequency and 1 W or more.

A heat sink 1 has a thermal conductivity of 200 W/cm or more and serves as GND. Semiconductor chips 2 and 3 such as GaN devices or GaAs devices are mounted on the heat sink 1 by a die bonding material 4. Metal lead terminals 5, 6 through which high frequency signals pass are connected to the semiconductor chips 2 and 3 by wires 7 and 8, respectively. The semiconductor chips 2 and 3 are connected to each other by a wire 9.

Dielectric materials 10, 11 having an adhesive function are stuck to the back surfaces of the lead terminals 5, 6 respectively, and the lead terminals 5, 6 are adhesively bonded to the heat sink 1 through the dielectric materials 10, 11. The dielectric materials 10, 11 are separated from each other and provided individually between the lead terminals 5, 6 and the heat sink 1, respectively. Note that the dielectric materials 10, 11 themselves may have an adhesive function, or adhesive agents may be provided on both the upper and lower surfaces of the dielectric materials 10, 11. In order to protect the semiconductor chips 2 and 3 from foreign matters, external force or the like, the semiconductor chips 2 and 3, the lead terminals 5, 6, and the dielectric materials 10, 11 are sealed with sealing resin 12 made of epoxy resin by mold-sealing. After the sealing, parts of the lead terminals 5, 6 are cut, and packages are individually separated into pieces.

Here, in the prior art which does not have the dielectric materials 10, 11, the dielectric constant of the material between the lead terminal and the heat sink is fixed to about 4.0 of the epoxy resin. In addition, the distance between the lead terminal and the heat sink can only be reduced to about 0.25 in consideration of the processing accuracy of the frame or the subsequent assembling performance and wire bonding performance. When the width of a lead terminal through which a high frequency signal passes is 0.5 mm, the characteristic impedance is about 46.5Ω in the prior art. On the other hand, in the present embodiment, for example, when a polyimide material having a thickness of 0.1 mmt and a dielectric constant of about 3.2 is adopted as the dielectric materials 10, 11, the characteristic impedance is about 29.5Ω, and the characteristic impedance can be greatly changed.

As described above, in the present embodiment, the dielectric materials 10, 11 are individually provided between the lead terminals 5, 6 and the heat sink 1, and separated from each other. Therefore, the area where the lead terminals 5, 6 through which high frequency signals pass overlap the heat sink 1 in the two-dimensional plane, and the dielectric constant and thickness of the dielectric materials 10, 11 between the lead terminals 5, 6 and the heat sink 1 can be individually adjusted. Therefore, the characteristic impedances of the lead terminals 5, 6 through which high frequency signals pass can be set to values optimum for the characteristics of the GaN devices. As a result, the loss of the high frequency characteristic can be suppressed.

Second Embodiment

Figure 3:
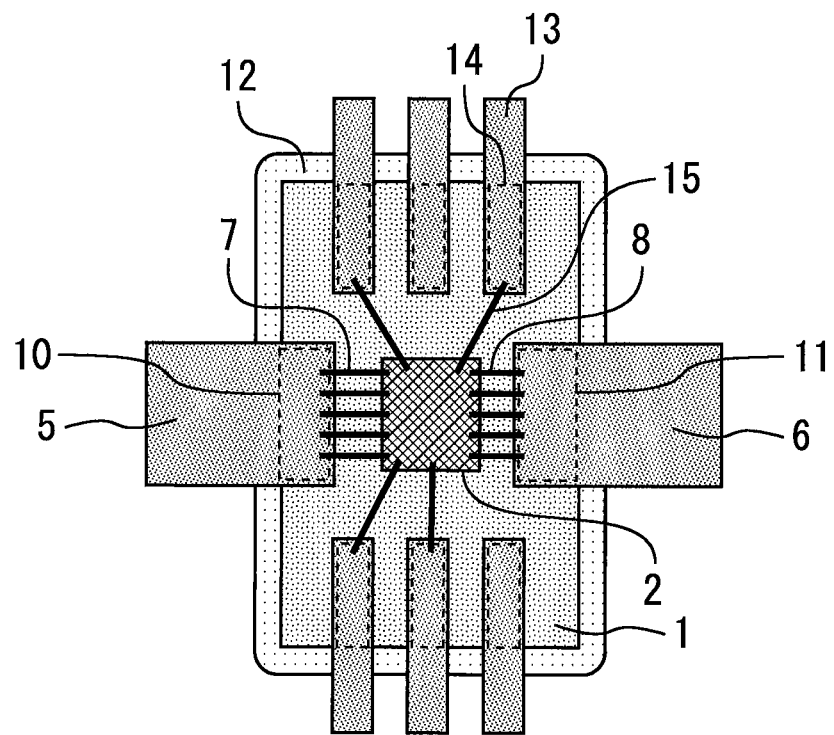
FIG. 3 is a plan view showing the inside of a semiconductor device according to a second embodiment of the present invention.

FIG. 3 is a plan view showing the inside of a semiconductor device according to a second embodiment of the present invention. In the present embodiment, dielectric materials 14 are individually provided between the heat sink 1 and lead terminals 13 through which DC bias passes. The dielectric materials 14 having an adhesive function are adhesively bonded to the back surfaces of the lead terminals 13, and the lead terminals 13 are adhesively bonded to the heat sink 1 through the dielectric materials 14. The lead terminals 13 are fixed to the heat sink 1 by the dielectric materials 14 and connected to a semiconductor chip 2 by wires 15. As a result, with respect to the terminals other than the lead terminals 5, 6 through which high frequency signals pass, the wire bonding performance is also enhanced, and the lead frame and the heat sink 1 can be more firmly fixed to each other. Other configurations and effects are similar to those of the first embodiment.

Third Embodiment

Figure 4:
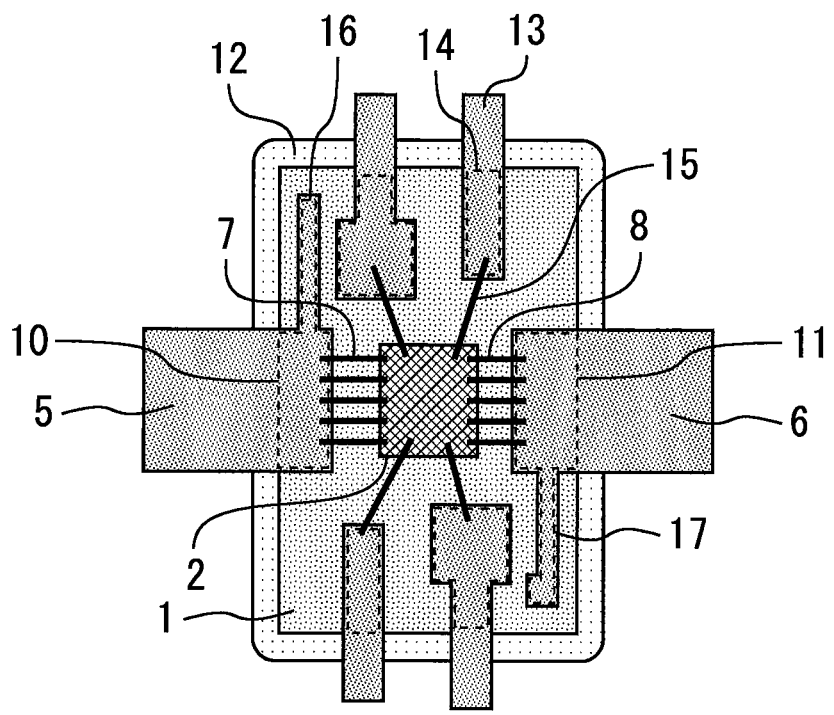
FIG. 4 is a plan view showing the inside of a semiconductor device according to a third embodiment of the present invention.

FIG. 4 is a plan view showing the inside of a semiconductor device according to a third embodiment of the present invention. Electrode portions 16, 17 protrude from side surfaces of lead terminals 5, 6 through which high frequency signals pass, respectively. The shapes of the electrode portions 16, 17 is not particularly limited. A dielectric material 10 between the electrode portion 16 and the heat sink 1, the electrode portion 16, and the heat sink 1 constitute a capacitor. The same applies to the electrode portion 17.

With respect to the area S where the heat sink 1 and the electrode portion 16 two-dimensionally overlap each other, and the dielectric constant εr and thickness t of the dielectric material 10, the capacitance value C of the capacitor is determined by C=εr×S/t. By adjusting these parameters, the capacitance value of the capacitor can be set to be optimal for the characteristic of the GaN device.

When a capacitor such as an open stub is required on a high frequency signal line, the function thereof can be added to the lead terminal by the present structure. As a result, the characteristic of the GaN device can be brought out at the maximum. In addition, since a part of the lead frame is configured as a capacitor, no additional component cost is required, which leads to the cost reduction of the device.

Fourth Embodiment

Figure 5:
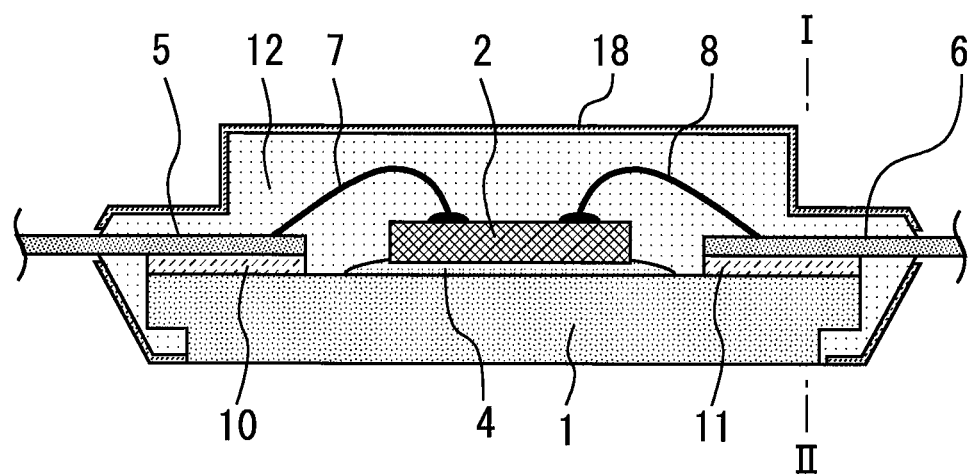
FIG. 5 is a cross-sectional view showing a semiconductor device according to a fourth embodiment of the present invention.
Figure 6:
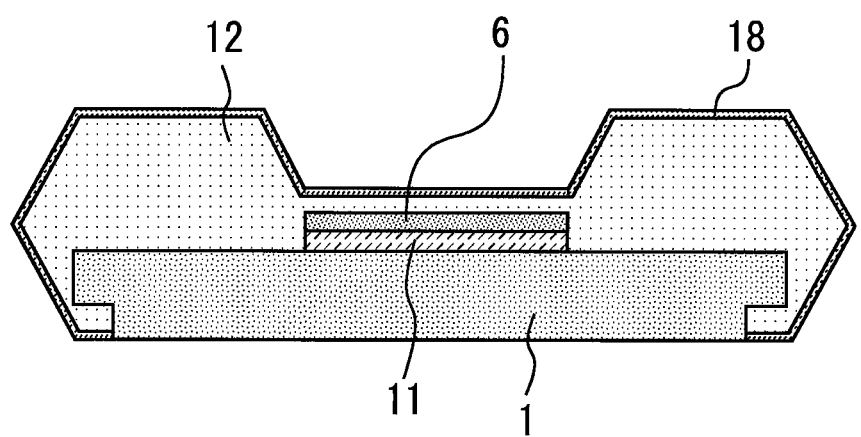
FIG. 6 is a cross-sectional view taken along line I-II of FIG. 5.

FIG. 5 is a cross-sectional view showing a semiconductor device according to a fourth embodiment of the present invention. FIG. 6 is a cross-sectional view taken along line I-II of FIG. 5. The top surface of the sealing resin 12 is molded into a concave shape. Note that the top surface of the sealing resin 12 may be molded into a convex shape. A metal film 18 is formed on the entire surface of the sealing resin 12 containing this concave portion. The metal film 18 is connected to the heat sink 1 serving as GND or the lead terminals. As a result, the lead terminals 5, 6 passing high-frequency signals therethrough have a structure like a stripline which is surrounded at the upper and lower sides thereof by GND shields. Therefore, electromagnetic waves leaking from the lead terminals 5, 6 are reduced, and the influence of electromagnetic waves from the outside is reduced, so that the characteristic of the GaN device can be stabilized. In addition, the thickness of the sealing resin 12 arranged on the lead terminals 5, 6 are adjusted to optimize the distance between the lead terminals 5, 6 and the metal film 18, so that the design freedom of the characteristic impedance is increased.

Fifth Embodiment

Figure 7:
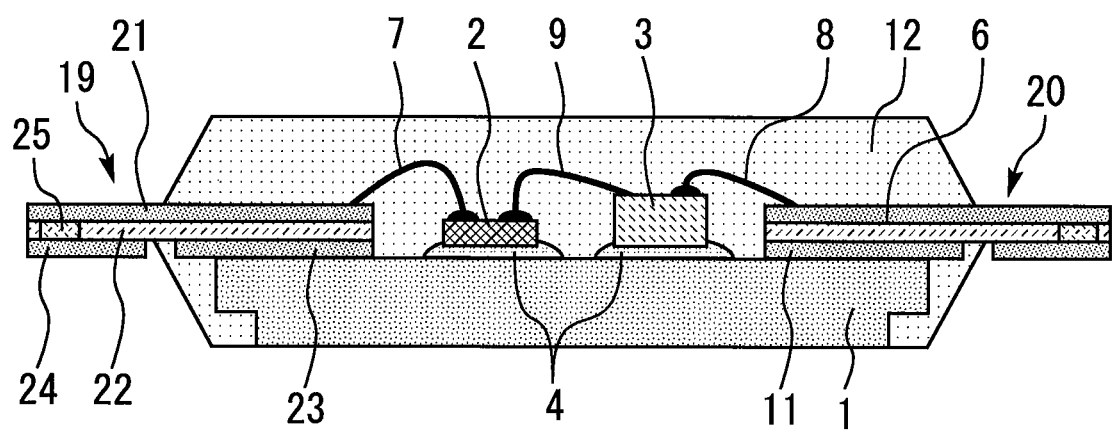
FIG. 7 is a cross-sectional view showing a semiconductor device according to a fifth embodiment of the present invention.
Figure 8:
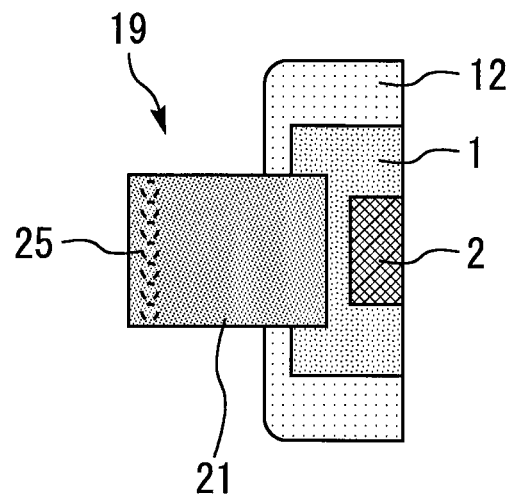
FIG. 8 is an enlarged top view of a lead terminal according to the fifth embodiment of the present invention.
Figure 9:
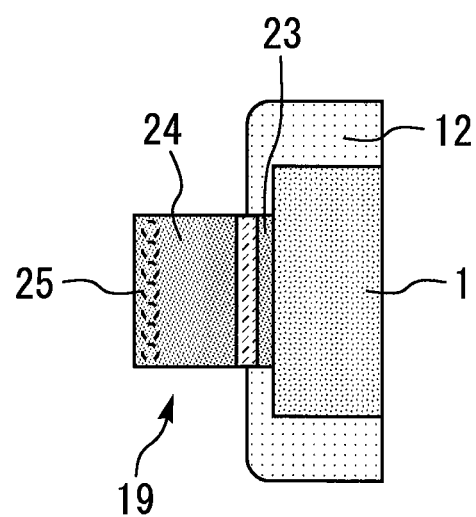
FIG. 9 is an enlarged bottom view of the lead terminal according to the fifth embodiment of the present invention.

FIG. 7 is a cross-sectional view showing a semiconductor device according to a fifth embodiment of the present invention. FIG. 8 is an enlarged top view of a lead terminal according to the fifth embodiment of the present invention. FIG. 9 is an enlarged bottom view of the lead terminal according to the fifth embodiment of the present invention. Each of lead terminals 19, 20 is not a single metal body, but has a three-layer structure of an upper surface metal 21, a dielectric material 22, and lower surface metals 23, 24.

The upper surface metal 21 is formed on the upper surface of the dielectric material 22. The lower surface metal 23 is formed on the lower surface of the dielectric material 22 inside the sealing resin 12, and is directly adhesively bonded to the heat sink 1 with a conductive adhesive agent or the like. The lower surface metal 24 is formed on the lower surface of the dielectric material 22 outside the sealing resin 12. A via hole 25 penetrates through the dielectric material 22 and connects the upper surface metal 21 and the lower surface metal 24 in the neighborhood of an end portion of each of the lead terminals 19, 20 outside the sealing resin 12. The lower surface metal 23 and the lower surface metal 24 are separated from each other so as to be electrically insulated from each other at a boundary between the inside and the outside of the sealing resin 12.

In the present embodiment, the characteristic impedance can be optimized by the structural design of the lead terminals 19, 20. However, when a high frequency signal is transmitted on the upper surfaces of the lead terminals 19, 20, the signal cannot be easily connected even when a package is mounted on a secondary mounting substrate. Therefore, the upper surface metal 21 and the lower surface metal 24 are connected to each other by the via hole 25 to transmit the signal to the lower surfaces of the lead terminals 19, 20. The lower surface metal 24 is an electrode pad to be bonded to the secondary mounting substrate.

In the first to fourth embodiments, the portion where the heat sink 1 and the lead terminals 19, 20 overlap each other can be set to an optimum impedance. However, since the heat sink 1 does not exist under the lead terminals 19, 20 between the end portion of the heat sink 1 and the end of the secondary mounting substrate, the characteristic impedance is deviated although the distance is short. On the other hand, in the present embodiment, the lower surface metal 23 extends to the outside beyond the end portion of the heat sink 1. Therefore, the lower surface metal 23 serving as GND is also present on the lower surface of the lead terminals 19, 20 between the end portion of the heat sink 1 and the end portion of the secondary mounting substrate, so there the characteristic impedance is not deviated, and the loss of the high frequency characteristic can be suppressed.

REFERENCE SIGNS LIST

1 heat sink; 2,3 semiconductor chip; 5,6,13,19,20 lead terminal; 10,11,14 dielectric material; 12 sealing resin; 16,17 electrode portion; 18 metal film; 21 upper surface metal; 23,24 lower surface metal; 25 via hole

The invention claimed is:

1. A semiconductor device comprising:
    a heat sink;
    a semiconductor chip mounted on the heat sink;
    plural lead terminals connected to the semiconductor chip and including a first lead terminal through which a high frequency signal passes;
    plural dielectric materials individually provided between the plural lead terminals and the heat sink and separated from each other;
    sealing resin sealing the semiconductor chip, the plural lead terminals and the plural dielectric materials,
    an electrode portion protrudes from a side surface of one of the plural lead terminals, and
    the dielectric material between the electrode portion and the heat sink, the electrode portion, and the heat sink constitute a capacitor.
2. The semiconductor device according to claim 1, wherein an area where the first lead terminal overlaps the heat sink, and a dielectric constant and thickness of the dielectric material between the first lead terminal and the heat sink are adjusted to set a characteristic impedance of the first lead terminal.

3. The semiconductor device according to claim 1, wherein the plural lead terminals include a second lead terminal through which DC bias passes, and
the second lead terminal is fixed to the heat sink by the dielectric material.

4. The semiconductor device according to claim 2, wherein the plural lead terminals include a second lead terminal through which DC bias passes, and
the second lead terminal is fixed to the heat sink by the dielectric material.

5. The semiconductor device according to claim 2, further comprising a metal film provided on a surface of the sealing resin and connected to the heat sink,
wherein a top surface of the sealing resin is molded into a concave shape or a convex shape.

6. The semiconductor device according to claim 3, further comprising a metal film provided on a surface of the sealing resin and connected to the heat sink,
wherein a top surface of the sealing resin is molded into a concave shape or a convex shape.

7. The semiconductor device according to claim 1, further comprising a metal film provided on a surface of the sealing resin and connected to the heat sink,
wherein a top surface of the sealing resin is molded into a concave shape or a convex shape.

8. A semiconductor device comprising:
a heat sink;
a semiconductor chip mounted on the heat sink;
a lead terminal connected to the semiconductor chip and through which a high frequency signal passes; and
sealing resin sealing the semiconductor chip and the lead terminal,
wherein the lead terminal includes a dielectric material, an upper surface metal provided on an upper surface of the dielectric material, a first lower surface metal provided on a lower surface of the dielectric material inside the sealing resin and bonded to the heat sink, a second lower surface metal provided on a lower surface of the dielectric material outside the sealing resin, and a via hole penetrating through the dielectric material and connecting the upper surface metal and the lower surface metal,
the second lower surface metal extends to an outside beyond an end portion of the heat sink, and
the first lower surface metal and the second lower surface metal are separated from each other so as to be electrically insulated from each other.

* * * * *